(12) United States Patent
Kim et al.

(10) Patent No.: US 11,690,261 B2
(45) Date of Patent: Jun. 27, 2023

(54) DISPLAY PANEL

(71) Applicant: Samsung Display Co., Ltd., Yongin-si (KR)

(72) Inventors: Jeongki Kim, Hwaseong-si (KR); Jang-Il Kim, Asan-si (KR); Jong-Hoon Kim, Seoul (KR); YeoGeon Yoon, Suwon-si (KR); Myoungjong Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 124 days.

(21) Appl. No.: 16/741,742

(22) Filed: Jan. 14, 2020

(65) Prior Publication Data

US 2020/0273929 A1     Aug. 27, 2020

(51) Int. Cl.
*H10K 59/127* (2023.01)
*H10K 50/856* (2023.01)
*H10K 50/842* (2023.01)
*H10K 59/35* (2023.01)
*H10K 59/38* (2023.01)
*H10K 50/86* (2023.01)

(52) U.S. Cl.
CPC ....... *H10K 59/127* (2023.02); *H10K 50/8428* (2023.02); *H10K 50/856* (2023.02); *H10K 59/35* (2023.02); *H10K 59/38* (2023.02); *H10K 50/865* (2023.02)

(58) Field of Classification Search
CPC .............. H01L 27/3211; H01L 27/322; H01L 27/3251; H01L 51/525; H01L 51/5271; H01L 51/5284
See application file for complete search history.

(56) References Cited

U.S. PATENT DOCUMENTS

| | | | |
|---|---|---|---|
| 9,647,229 B2 | 5/2017 | Nakazawa et al. | |
| 10,185,066 B2 | 1/2019 | Chae et al. | |
| 10,197,844 B2 | 2/2019 | Lee et al. | |
| 2003/0146695 A1* | 8/2003 | Seki ................... | H01L 51/5284 313/506 |

(Continued)

FOREIGN PATENT DOCUMENTS

| | | | |
|---|---|---|---|
| JP | 2006252988 | * | 9/2006 |
| KR | 10-2014-0096270 | | 8/2014 |

(Continued)

*Primary Examiner* — Ahmed N Sefer
(74) *Attorney, Agent, or Firm* — H.C. Park & Associates, PLC

(57) ABSTRACT

A display panel includes an upper display substrate, a lower display substrate, and a partition wall. The upper display substrate includes a display area and a non-display area adjacent to the display area. The display area includes pixel areas and a light blocking area adjacent to the pixel areas. The lower display substrate includes display elements configured to emit light having a first color and respectively overlapping the pixel areas. The partition wall includes a partition wall part overlapping the light blocking area and a reflection part disposed on the partition wall part. The upper display substrate includes a base substrate, a color filter layer disposed on the base substrate, and a light control layer disposed on the color filter layer. The light control layer is configured to control the light having the first color. The partition wall is disposed on the light control layer.

18 Claims, 14 Drawing Sheets

(56) References Cited

U.S. PATENT DOCUMENTS

| | | | |
|---|---|---|---|
| 2003/0201712 A1* | 10/2003 | Park | H01L 27/3253 313/504 |
| 2015/0318339 A1* | 11/2015 | Nakamura | H01L 51/5228 257/98 |
| 2016/0285048 A1* | 9/2016 | Chung | G02F 1/1339 |
| 2018/0067353 A1* | 3/2018 | Son | G09G 3/20 |
| 2018/0088261 A1 | 3/2018 | Song et al. | |
| 2018/0101056 A1 | 4/2018 | Lee et al. | |
| 2020/0135799 A1* | 4/2020 | Chen | H01L 25/0753 |
| 2020/0219937 A1 | 7/2020 | Ahn et al. | |
| 2021/0376052 A1* | 12/2021 | Park | H01L 27/3279 |

FOREIGN PATENT DOCUMENTS

| | | |
|---|---|---|
| KR | 10-2018-0018945 | 2/2018 |
| KR | 10-2018-0035287 | 4/2018 |
| KR | 10-2018-0039218 | 4/2018 |
| KR | 10-2018-0044474 | 5/2018 |
| KR | 10-2020-0084967 | 7/2020 |

\* cited by examiner

DISPLAY PANEL

CROSS-REFERENCE TO RELATED APPLICATION

This application claims priority from and the benefit of Korean Patent Application No. 10-2019-0023273, filed Feb. 27, 2019, which is hereby incorporated by reference for all purposes as if fully set forth herein.

BACKGROUND

Field

Exemplary embodiments generally relate to a display panel, and, more particularly, to a display panel configured to prevent (or at least reduce) mixing of colors.

Discussion

Various display devices may be used in association with multimedia equipment, such as televisions, mobile phones, table computers, navigation devices, game consoles, and/or the like. A display device may be a transmissive-type display panel selectively transmitting source light generated from a light source or an emission-type display panel generating source light in the display panel itself. When the display device is used in an outdoor space, reflection and scattering may occur on a display surface, on which an image is visible, by external light.

The above information disclosed in this section is only for understanding the background of the inventive concepts, and, therefore, may contain information that does not form prior art.

SUMMARY

Some exemplary embodiments provide a display panel capable of preventing (or at least reducing) mixing of colors.

Additional aspects will be set forth in the detailed description which follows, and, in part, will be apparent from the disclosure, or may be learned by practice of the inventive concepts.

According to some exemplary embodiments, a display panel includes an upper display substrate, a lower display substrate, and a partition wall. The upper display substrate includes a display area and a non-display area adjacent to the display area. The display area includes pixel areas and a light blocking area adjacent to the pixel areas. The lower display substrate includes display elements configured to emit light having a first color and respectively overlapping the pixel areas. The partition wall includes a partition wall part overlapping the light blocking area and a reflection part disposed on the partition wall part. The upper display substrate includes a base substrate, a color filter layer disposed on the base substrate, and a light control layer disposed on the color filter layer. The light control layer is configured to control the light having the first color. The partition wall is disposed on the light control layer.

According to some exemplary embodiments, a display panel includes an upper display substrate, a lower display substrate, and a partition wall. The upper display substrate includes a display area and a non-display area adjacent to the display area. The display area includes pixel areas and a light blocking area adjacent to the pixel areas. The lower display substrate includes display elements respectively overlapping the pixel areas. The partition wall is disposed between the upper display substrate and the lower display substrate. The partition wall includes a partition wall part overlapping the light blocking area and a reflection part covering the partition wall part. A height between the upper display substrate and the lower display substrate is defined as a first length in a thickness direction of the upper display substrate. A height of the partition wall is defined as a second length in the thickness direction. The second length is 0.6 times to 0.95 times the first length.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
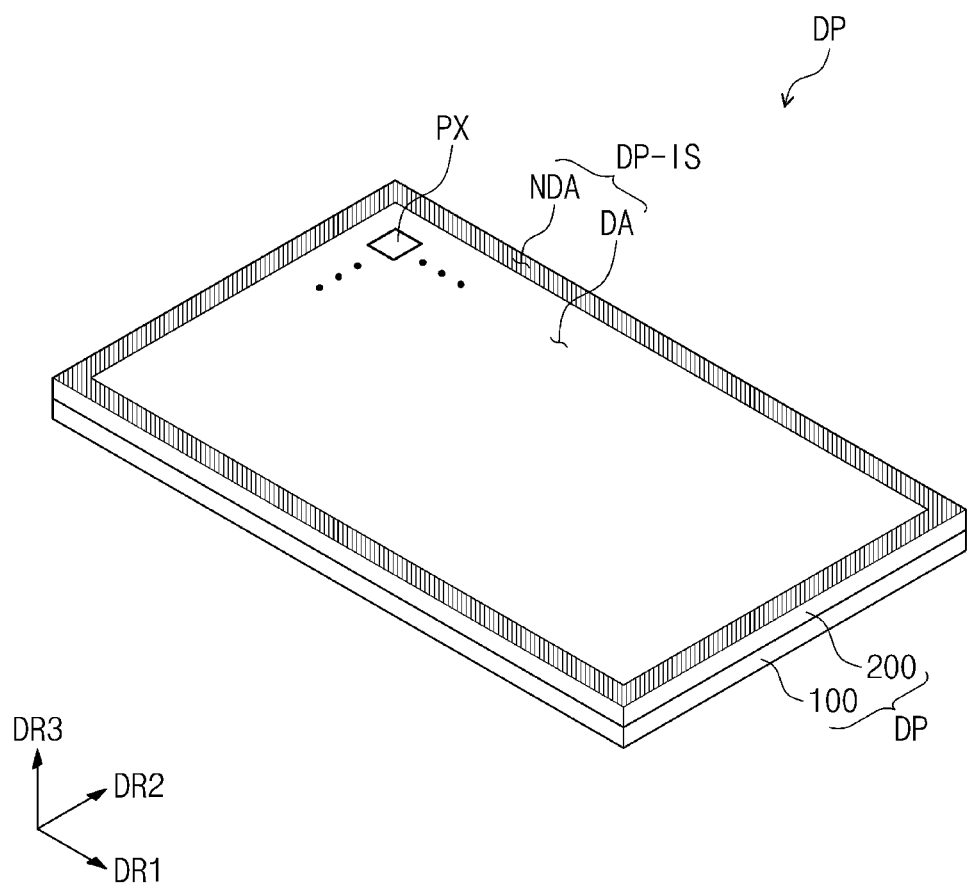
FIG. 1 is a perspective view of a display panel according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
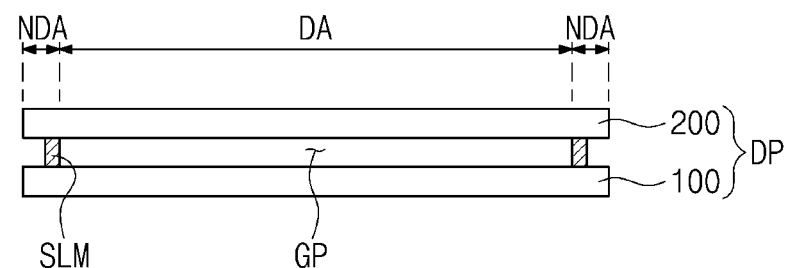
FIG. 2 is a cross-sectional view of the display panel of FIG. 1 according to some exemplary embodiments.
Figure 2:
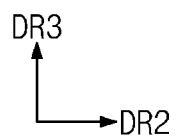

FIG. 1 is a perspective view of a display panel according to some exemplary embodiments. FIG. 2 is a cross-sectional view of the display panel of FIG. 1 according to some exemplary embodiments.

A display panel DP according to some exemplary embodiments may be applied to large-sized electronic devices, such as a monitor, an external billboard, etc., as well as small and mid-sized electronic devices, such as a personal computer, a notebook computer, a personal digital terminal, a car navigation unit, a game console, a smart phone, a tablet, a camera, and the like. Also, the above-described devices are exemplified as merely some exemplary embodiments, and, thus, the display panel DP may be adopted for other electronic equipment.

According to some exemplary embodiments, the display panel DP may be at least one of a liquid crystal display panel, an electrophoretic display panel, a microelectromechanical system (MEMS) display panel, an electrowetting display panel, and an organic light emitting display panel, but exemplary embodiments are not limited thereto.

Although not separately shown, the display panel DP may further include a chassis member or a molding member, and also may further include a backlight unit when the display panel DP is, for example, a liquid crystal display panel. Hereinafter, the display panel DP will be described as an organic light emitting display panel.

Referring to FIG. 1, the display panel DP may include a lower display substrate 100 and an upper display substrate 200 facing the lower display substrate 100 and spaced apart from the lower display substrate 100. As illustrated in FIG. 1, the display panel DP may display an image through a display surface DP-IS. The display surface DP-IS is parallel to a surface defined by a first direction DR1 and a second direction DR2.

The display surface DP-IS may include a display area DA and a non-display area NDA. A pixel PX is disposed on the display area DA and is not disposed on the non-display area NDA. The non-display area NDA may be defined outside, e.g., along an edge of the display surface DP-IS. According to some exemplary embodiments, the display area DA may be surrounded by the non-display area NDA. However, exemplary embodiments are not limited thereto. For instance, the non-display area NDA may be adjacent to one side of the display area DA or may be omitted.

A normal direction of the display surface DP-IS, e.g., a thickness direction of the display panel DP, is indicated as a third direction DR3. In this specification, "when viewed on a plane," "when viewed on the plane," or "when viewed in a plan view" may mean a view in the third direction DR3. A front surface (or a top surface) and a rear surface (or a bottom surface) of each of layers or units, which will be described below, are distinguished by the third direction DR3. However, directions indicated as the first to third direction DR1, DR2, and DR3 may be changed into different directions, for example, opposite directions as a relative concept.

Although the display panel DP having a planar display surface DP-IS is illustrated as an example, exemplary embodiments are not limited thereto. The display panel DP may include a display surface of which at least a portion has a curved shape or a display surface having a solid shape on the plane. The solid display surface may include a plurality of display areas that indicate different directions.

Referring to FIG. 2, an inner space GP may be defined between the upper display substrate 200 and the lower display substrate 100. The inner space GP may be maintained by an adhesion member SLM disposed between the upper display substrate 200 and the lower display substrate 100. For example, the adhesion member SLM may include at least one of an organic adhesion member and an inorganic adhesion member.

Figure 3A:
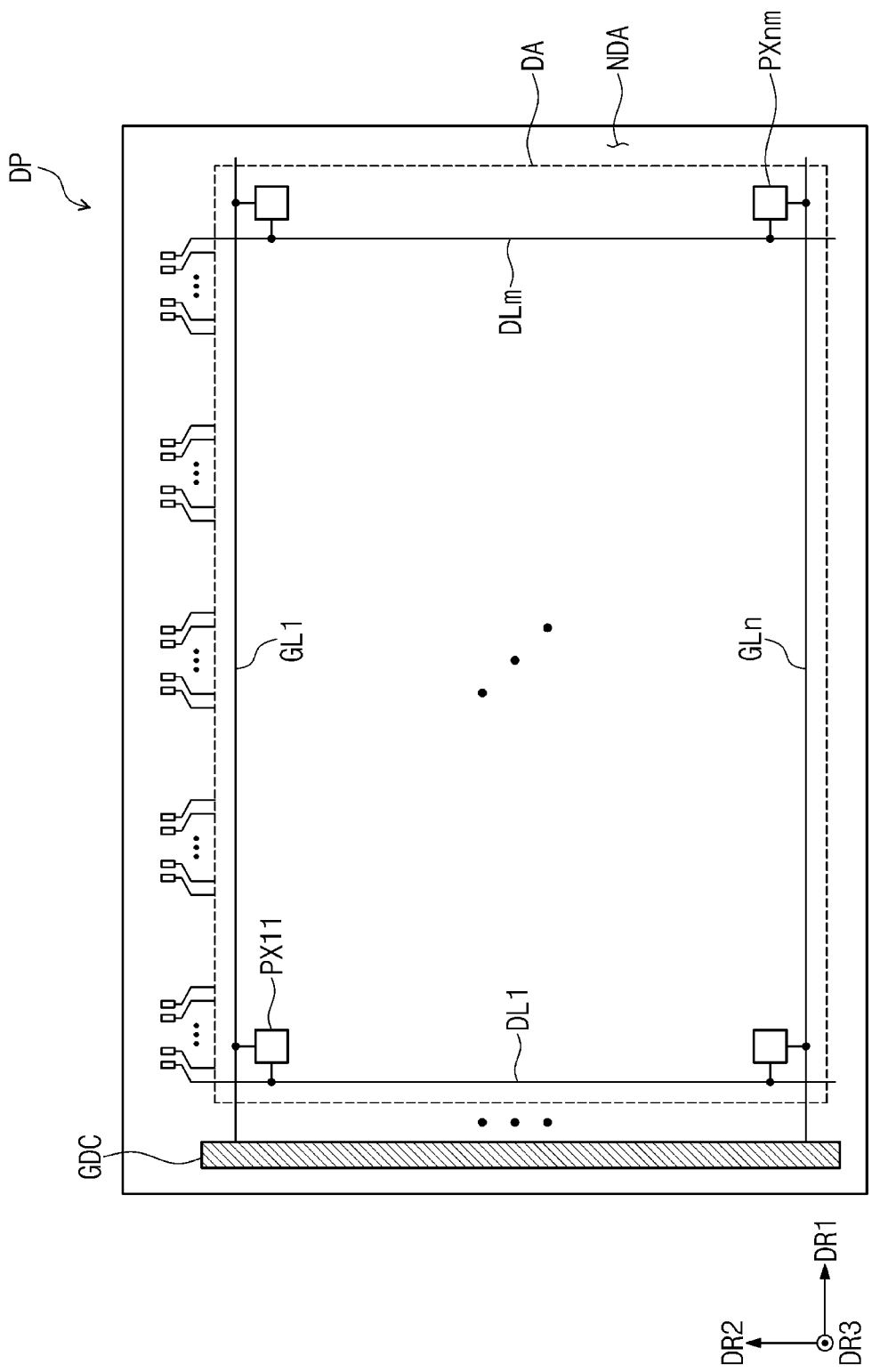
FIG. 3A is a plan view illustrating the display panel of FIG. 1 according to some exemplary embodiments.
Figure 3B:
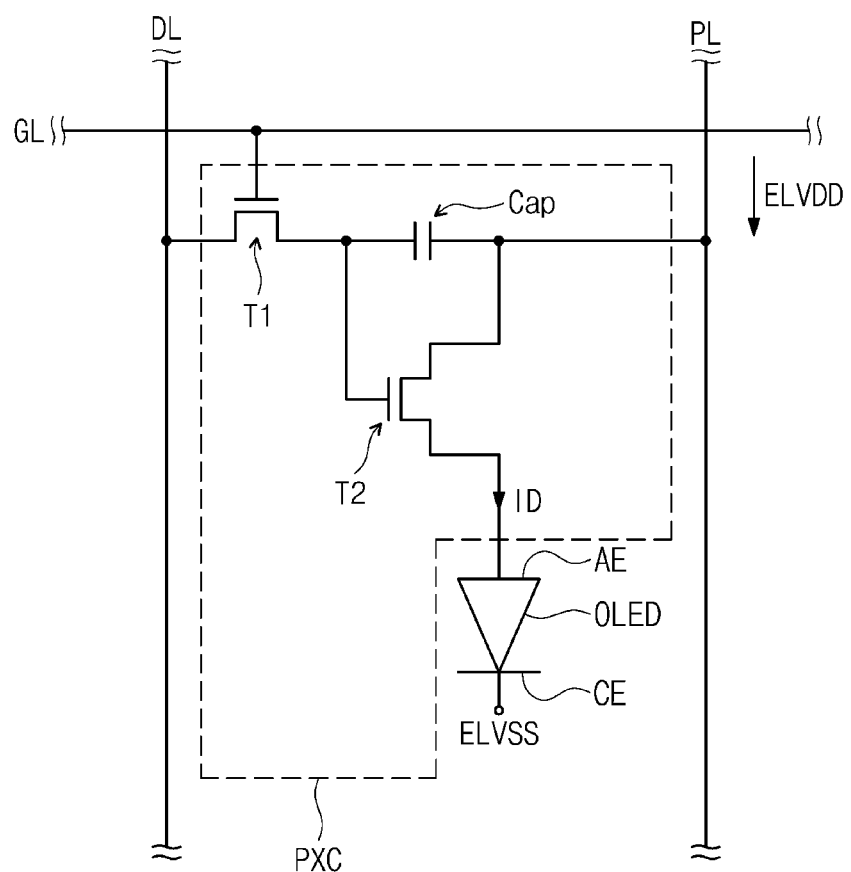
FIG. 3B is an equivalent circuit diagram of a pixel according to some exemplary embodiments.

FIG. 3A is a plan view illustrating the display panel of FIG. 1 according to some exemplary embodiments. FIG. 3B is an equivalent circuit diagram of a pixel according to some exemplary embodiments.

Referring to FIG. 3A, an arrangement relationship between signal lines GL1 to GLn and DL1 to DLm and pixels PX11 to PXnm on a plane is illustrated. The signal lines GL1 to GLn and DL1 to DLm may include a plurality of gate lines GL1 to GLn, and a plurality of data lines DL1 to DLm.

Each of the pixels PX11 to PXnm are connected to the corresponding gate lines of the plurality of gate lines GL1 to GLn and the corresponding data lines of the plurality of data lines DL1 to DLm, respectively. As will become more apparent below, each of the pixels PX11 to PXnm may include a pixel driving circuit and a display element. Additional and/or alternative kinds of signal lines may be provided on the display panel DP according to a configuration of the pixel driving circuit.

The pixels PX11 to PXnm may be disposed in a matrix form, but exemplary embodiments are not limited thereto. The pixels PX11 to PXnm may be disposed in the form of a pentile arrangement or any other suitable arrangement. For instance, the pixels PX11 to PXnm may be disposed in the form of a diamond.

A gate driving circuit GDC may be disposed on the non-display area NDA. The gate driving circuit GDC may be integrated with the display panel DP through an oxide silicon gate driving circuit (OSG) process or an amorphous silicon gate driving circuit (ASG) process.

Referring to FIG. 3B, a pixel PX, which is connected to one gate line GL, one data line DL, and a power line PL, of the pixels PX11 to PXnm of FIG. 3A is illustrated as an example. However, exemplary embodiments are not limited to the configuration of the pixel PX as shown in FIG. 3B. For example, the pixel PX may be variously formed in alternative and/or additional configurations.

According to some exemplary embodiments, the pixel PX includes an light emitting element OLED, a first electrode AE, a second electrode CE, and a pixel circuit PXC. According to some exemplary embodiments, the light emitting element OLED may emit first color light. Hereinafter, in this specification, the first color light is defined as blue light, but exemplary embodiments are not limited thereto. Also, the light emitting element OLED may include a light emitting layer that generates light by itself. Hereinafter, the light emitting element OLED is described as an organic light emitting element, but exemplary embodiments are not limited thereto.

Figure 5:
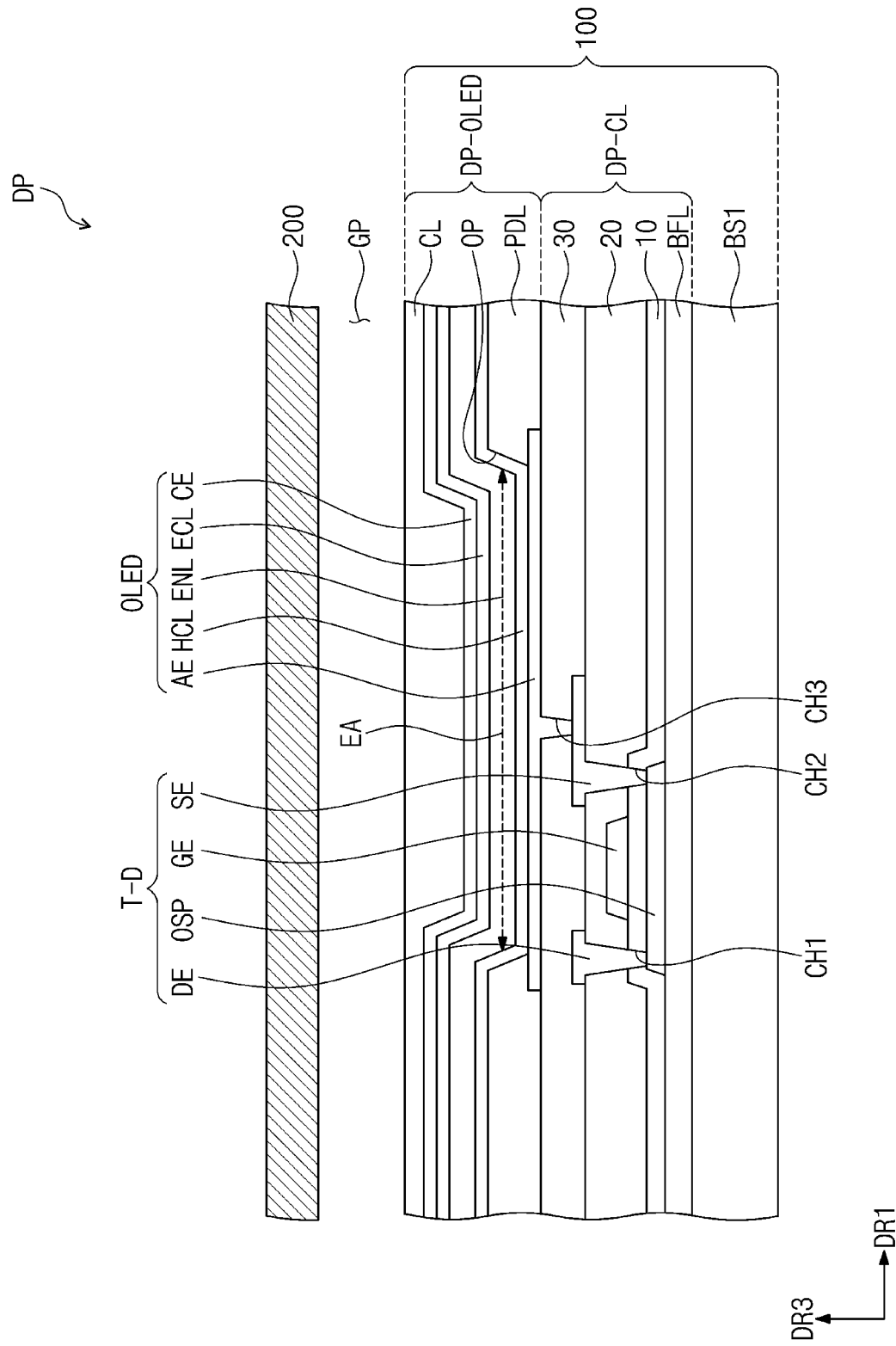
FIG. 5 is a cross-sectional view of a portion of a pixel area of the display panel of FIG. 1 according to some exemplary embodiments.

The light emitting element OLED, the first electrode AE, and the second electrode CE may be provided in a display element layer DP-OLED (see FIG. 5). The pixel PX includes a first transistor T1 (e.g., a switching transistor), a second transistor T2 (e.g., a driving transistor), and a capacitor Cap as a circuit unit for driving the light emitting element OLED. The pixel circuit PXC may be provided in a circuit element layer DP-CL (see FIG. 5).

The light emitting element OLED generates the first color light by electrical signals provided from the first and second transistors T1 and T2.

The first transistor T1 outputs a data signal applied to the data line DL in response to a gate signal applied to the gate line GL. The capacitor Cap charges a voltage to correspond to the data signal received from the first transistor T1. A first power voltage ELVDD is provided to the first electrode AE through the second transistor T2, and a second power voltage ELVSS is provided to the second electrode CE. The second power voltage ELVSS may be less than the first power voltage ELVDD.

The second transistor T2 is electrically connected to the light emitting element OLED through the first electrode AE. The second transistor T2 controls a driving current ID flowing through the light emitting element OLED in response to an amount of charge stored in the capacitor Cap. The light emitting element OLED emits light during a turn-on period of the second transistor T2.

Figure 4:
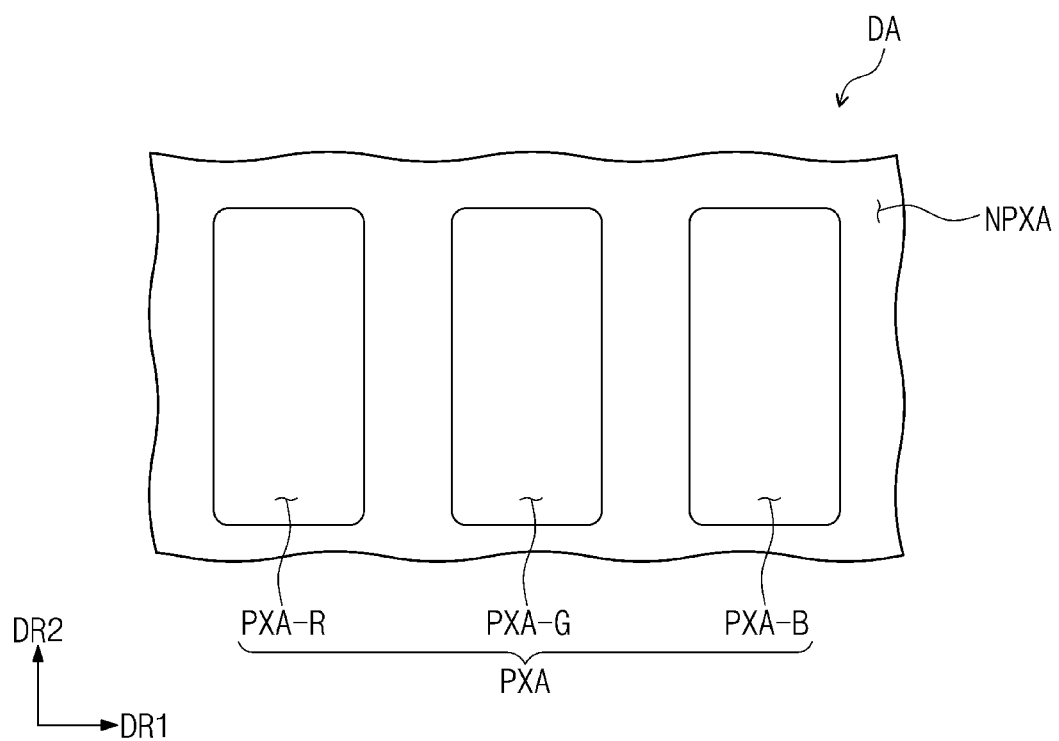
FIG. 4 is a plan view of pixel areas provided on a display area of the display panel of FIG. 1 according to some exemplary embodiments.

FIG. 4 is a plan view of pixel areas provided on the display area of the display panel of FIG. 1 according to some exemplary embodiments. FIG. 5 is a cross-sectional view of a portion of the pixel area of the display panel of FIG. 1 according to some exemplary embodiments.

For instance, FIG. 4 is an enlarged view illustrating a portion of the display area DA of FIG. 1. The display area DA may include a plurality of pixel areas PXA and a light blocking area NPXA adjacent to the plurality of pixel areas PXA. For convenience of description, three kinds of pixel areas PXA-R, PXA-G, and PXA-B will be mainly illustrated in FIG. 4. The three kinds of pixel areas PXA-R, PXA-G, and PXA-B of FIG. 4 may be repeatedly disposed throughout the display area DA.

A light blocking area NPXA is disposed outside (e.g., around) the first to third pixel areas PXA-R, PXA-G, and PXA-B. The first to third pixel areas PXA-R, PXA-G, and PXA-B and the light blocking area NPXA may be substantially defined on the upper display substrate 200. In this specification, a pixel area means an area through which light is actually emitted to the outside through the display surface DP-IS described with reference to FIG. 1.

Although the first to third pixel areas PXA-R, PXA-G, and PXA-B having the same surface area on the plane are illustrated in FIG. 4 as an example, exemplary embodiments are not limited thereto. The first to third pixel areas PXA-R, PXA-G, and PXA-B may have surface areas different from each other or have at least two or more areas different from each other.

Also, although the first to third pixel areas PXA-R, PXA-G, and PXA-B, each of which has a rectangular shape with a rounded corner area on the plane, are illustrated, exemplary embodiments are not limited thereto. The first to third pixel areas PXA-R, PXA-G, and PXA-B may have other polygonal shapes on the plane. Alternatively, each of first to third pixel areas PXA-R, PXA-G, and PXA-B may have a square shape having a rounded corner area.

One of the first to third pixel areas PXA-R, PXA-G, and PXA-B may provide a first color light having a wavelength band of a first color to the user, the other one of the first to third pixel areas PXA-R, PXA-G, and PXA-B may provide a second color light having a wavelength band of a second color different from the first color to the user, and the remaining pixel may provide a third color light having a wavelength band of a third color different from the first color and the second color to the user.

For example, the first pixel area PXA-R may emit red light, the second pixel area PXA-G may emit green light, and the third pixel area PXA-B may emit blue light. According to some exemplary embodiments, source light may be blue light that is the first color light. The source light may be generated in a light source, such as a backlight unit (now shown) or generated in a display element, such as a light emitting diode.

The light blocking area NPXA may set a boundary between the first to third pixel areas PXA-R, PXA-G, and PXA-B to prevent or at least reduce (hereinafter, collectively referred to as "prevent") the colors from being mixed with each other between the first to third pixel areas PXA-R, PXA-G, and PXA-B. Also, the light blocking area NPXA may block the source light so that the source light is not provided to the user.

For instance, the display panel DP according to some exemplary embodiments may include a partition wall overlapping the light blocking area NPXA. The partition wall may prevent light output from two pixel areas adjacent to each other from mixing and improve light emission efficiency of light emitted from each of the pixel areas. This will be described in more detail with reference to FIG. 6.

FIG. 5 illustrates a cross-section of the display panel DP corresponding to the second pixel area PXA-G and a cross-section corresponding to the driving transistor T-D and the light emitting element OLED. In FIG. 5, the upper display substrate 200 is schematically illustrated.

Referring to FIG. 5, the lower display substrate 100 includes a first base substrate BS1, a circuit element layer DP-CL disposed on the first base substrate BS1, and a display element layer DP-OLED disposed on the circuit element layer DP-CL.

The first base substrate BS1 may include, for example, a synthetic resin substrate or a glass substrate. The circuit element layer DP-CL includes at least one insulation layer and a circuit element. The circuit element includes the signal line and the driving circuit of the pixel. The circuit element layer DP-CL may be formed through a process of forming at least one insulation layer, a semiconductor layer, and a conductive layer by coating or deposition and a process of patterning the at least one insulation layer, the semiconductor layer, and the conductive layer by a photolithography process.

In some exemplary embodiments, the circuit element layer DP-CL may include a buffer layer BFL, a first insulation layer 10, a second insulation layer 20, and a third insulation layer 30. For example, each of the first insulation layer 10 and the second insulation layer 20 may be an inorganic layer, and the third insulation layer 30 may be an organic layer. However, exemplary embodiments are not limited thereto. For example, each of the first insulation layer 10 and the second insulation layer 20 may be a layer in which an inorganic layer and an organic layer are mixed with each other.

FIG. 5 illustrates an example of an arrangement relationship of a semiconductor pattern OSP, a control electrode GE, an input electrode DE, and an output electrode SE, which constitute the driving transistor T-D. First, second, and third through-holes CH1, CH2, and CH3 are illustrated exemplarily.

The display element layer DP-OLED includes the light emitting element OLED as a display element. The light emitting element OLED may generate the above-described source light. The light emitting element OLED includes the first electrode AE, the second electrode CE, and a light emitting layer ENL disposed between the first and second electrodes AE and CE. In some exemplary embodiments, the light emitting element OLED may include an organic light emitting diode. The display element layer DP-OLED includes a pixel defining layer PDL. For example, the pixel defining layer PDL may be an organic layer.

A first electrode AE is disposed on the third insulation layer 30. The first electrode AE is connected to the output electrode SE through the third through-hole CH3 passing through the third insulation layer 30. A light emitting opening OP is defined in the pixel defining layer PDL. According to some exemplary embodiments, the light emitting opening OP may be defined as an emission area EA on (or in) which the first color light is emitted from the light emitting layer ENL.

The light emitting opening OP of (or in) the pixel defining layer PDL exposes at least a portion of the first electrode AE. According to some exemplary embodiments, the light emitting opening OP may be defined as an emission area EA on which actual light is emitted from the light emitting element OLED. The emission area EA may be provided in plurality, and the plurality of emission areas EA may respectively correspond to the pixel areas.

A hole control layer HCL, the light emitting layer ENL, and an electron control layer ECL may be commonly disposed on the first electrode AE and the pixel defining layer PDL. The hole control layer HCL, the light emitting layer ENL, and the electron control layer ECL may be commonly disposed on the first to third pixel areas PXA-R, PXA-G, and PXA-B (see FIG. 4).

The hole control layer HCL may include a hole transport layer and may further include a hole injection layer. The light emitting layer ENL may generate blue light. The blue light may include a wavelength of about 410 nm to about 480 nm. An emission spectrum of the blue light may have a maximum peak within a wavelength of about 440 nm to about 460 nm. The electron control layer ECL may include an electron transport layer and may further include an electron injection layer. The light emitting layer ENL may have a tandem (or multilayer) structure or a single layer structure.

A second electrode CE is disposed on the electron control layer ECL. The second electrode CE may be commonly disposed on the first to third pixel areas PXA-R, PXA-G, and PXA-B. The second electrode CE may have a surface area greater than that of the first electrode AE. A cover layer CL protecting the second electrode CE may be further disposed on the second electrode CE. The cover layer CL may include at least one of an organic material and an inorganic material. In some exemplary embodiments, the cover layer CL may be omitted.

Although not separately shown, the lower display substrate 100 may include first to third light emitting elements corresponding to the first to third pixel areas PXA-R, PXA-G, and PXA-B of FIG. 4. The first to third light emitting elements may have the same laminated structure as each other and may also have the same laminated structure as the light emitting element OLED of FIG. 5, but exemplary embodiments are not limited thereto.

Figure 6:
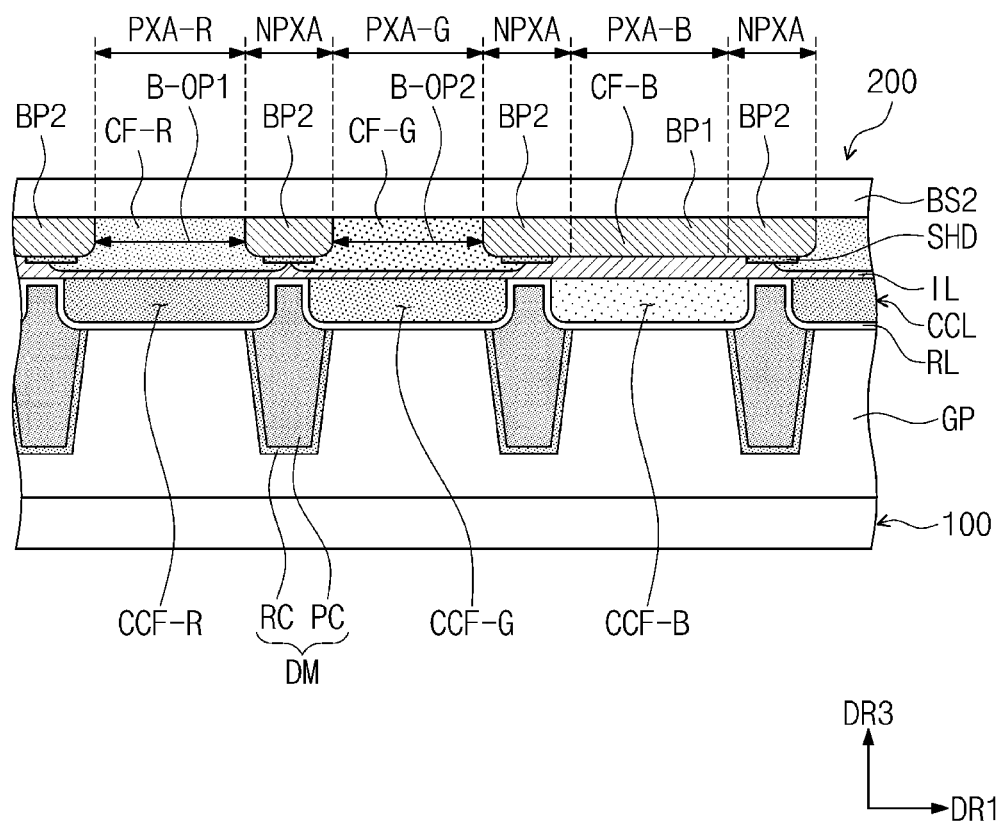
FIG. 6 is a cross-sectional view of an upper display substrate of the display panel of FIG. 1 according to some exemplary embodiments.
Figure 7A:
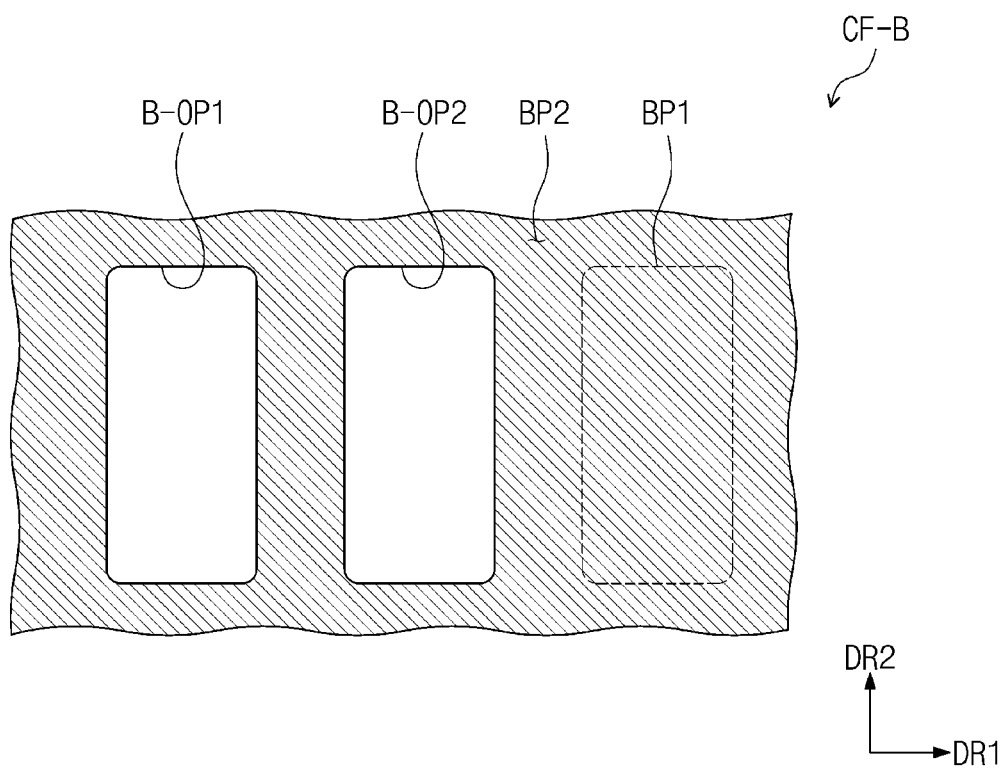
FIG. 7A is a plan view illustrating laminated structures of the upper display substrate of FIG. 6 according to some exemplary embodiments.
Figure 7B:
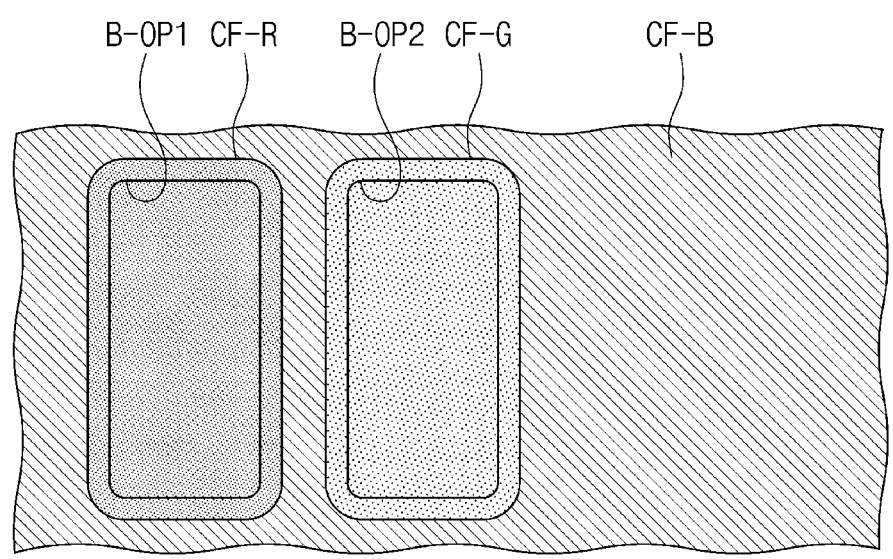
FIG. 7B is a plan view illustrating laminated structures of the upper display substrate of FIG. 6 according to some exemplary embodiments.
Figure 7C:
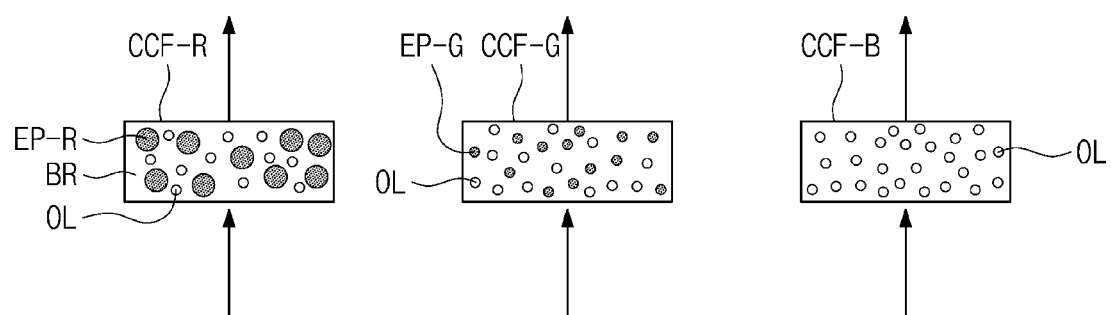
FIG. 7C is a schematic view illustrating light characteristics of a light control layer according to some exemplary embodiments.
Figure 8:
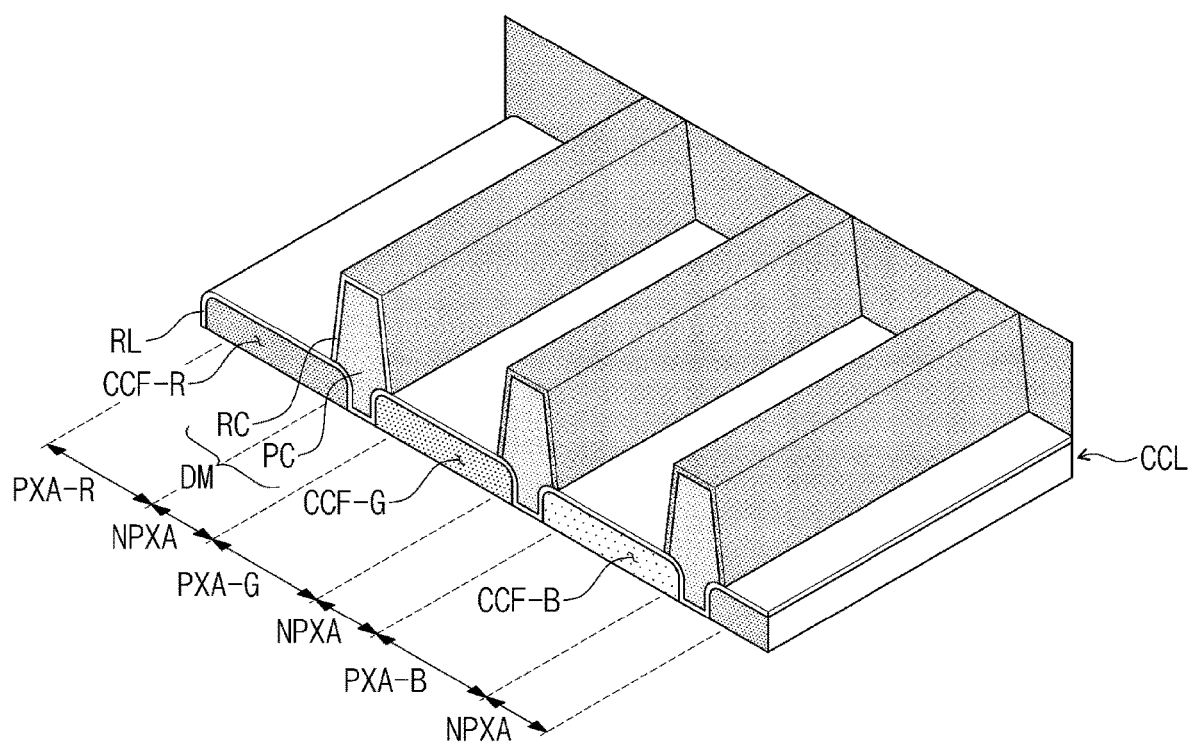
FIG. 8 is a perspective view of a partition wall according to some exemplary embodiments.
Figure 9:
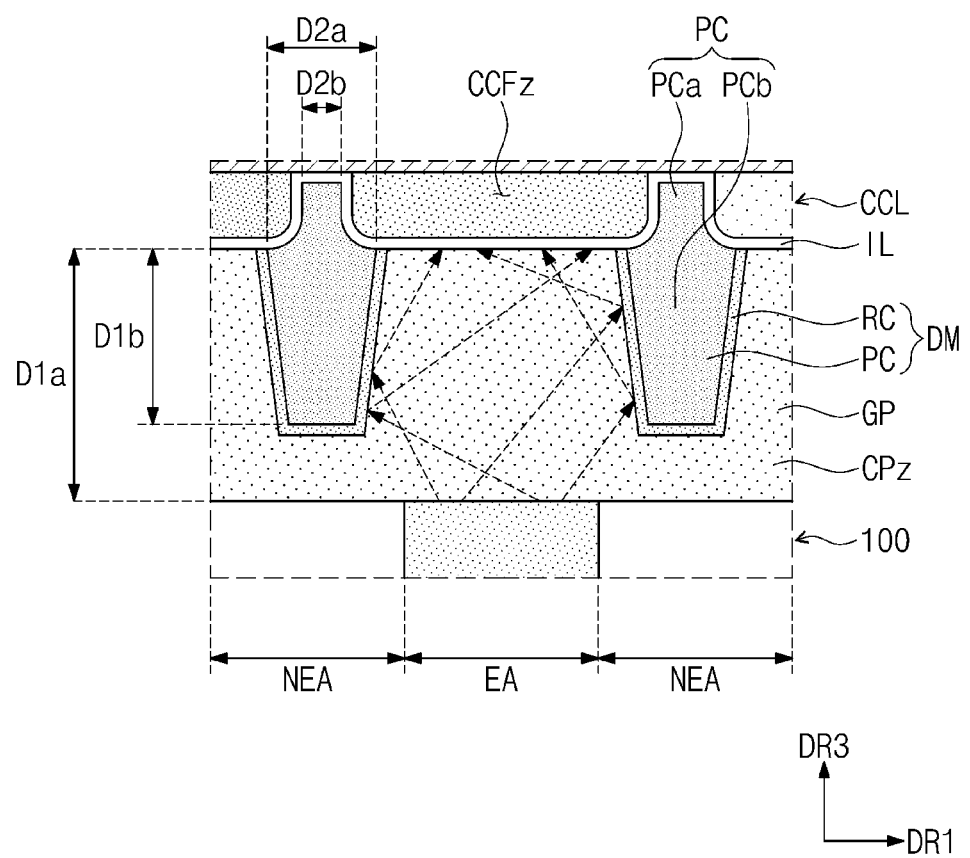
FIG. 9 is a cross-sectional view illustrating a portion of the display panel of FIG. 6 according to some exemplary embodiments.

FIG. 6 is a cross-sectional view of the upper display substrate of the display panel of FIG. 1 according to some exemplary embodiments. FIG. 7A is a plan view illustrating laminated structures of the upper display substrate according to some exemplary embodiments. FIG. 7B is a plan view illustrating laminated structures of the upper display substrate according to some exemplary embodiments. FIG. 7C is a schematic view illustrating light characteristics of a light control layer according to some exemplary embodiments. FIG. 8 is a perspective view of the partition wall according to some exemplary embodiments. FIG. 9 is a cross-sectional view illustrating a portion of the display panel of FIG. 6 according to some exemplary embodiments.

Referring to FIG. 6, the upper display substrate 200 includes a second base substrate BS2, first to third color filters CF-R, CF-G, and CF-B, a first upper insulation layer IL, a light control layer CCL, and a second upper insulation layer RL. Although not separately shown, according to some exemplary embodiments, when the display elements corresponding to the first to third pixel areas PXA-R, PXA-G, and PXA-B generate light having colors different from each other, the light control layer CCL may be omitted.

The first to third color filters CF-R, CF-G, and CF-B may be disposed on the second base substrate BS2. The first to third color filters CF-R, CF-G, and CF-B may be defined as constituents provided in the color filter layer. According to some exemplary embodiments, the first to third color filters CF-R, CF-G, and CF-B may be disposed directly on the second base substrate BS2.

In this specification, "a constituent A is disposed directly on a constituent B" may mean that an adhesion member is not disposed between the constituents A and B. For instance, the first to third color filters CF-R, CF-G, and CF-B may be disposed directly on the second base substrate BS2 without using an adhesion layer.

The first color filter CF-R may overlap the first pixel area PXA-R to transmit light having a wavelength range of a second color different from the first color and absorb light having other wavelength ranges. For example, the second color may be a red color. The second color filter CF-G may overlap the second pixel area PXA-G to transmit light having a wavelength range of a third color different from the second color and absorb light having other wavelength ranges. For example, the third color may be a green color. The third color filter CF-B may overlap the third pixel area PXA-B to transmit light corresponding to the wavelength range of the first color and absorb light having other wavelength ranges.

According to some exemplary embodiments, the first to third color filters CF-R, CF-G, and CF-B overlapping the display area DA may be partitioned by a light blocking layer SHD or a light blocking portion BP2.

According to some exemplary embodiments, the third color filter CF-B may be provided at a refractive index similar to that of the second base substrate BS2 rather than that of each of the first color filter CF-R and the second color filter CF-G. As a result, external light introduced from the outside may pass through the second base substrate BS2 and then be incident into the third color filter CF-B. Thus, external light reflection occurring on an interface between the second base substrate BS2 and the third color filter CF-B may be reduced. However, exemplary embodiments are not limited thereto. For example, each of the first to third color filters CF-R, CF-G, and CF-B may have a refractive index similar to that of the second base substrate BS2.

The third color filter CF-B may be divided into a filter portion BP1 serving as a color filter and the light blocking portion BP2 performing a light blocking function. The filter portion BP1 may overlap the third pixel area PXA-B, and the light blocking portion BP2 may overlap the light blocking area NPXA.

For instance, referring to FIG. 7A, an organic layer having a blue color is formed on one surface of the second base substrate BS, and then, the organic layer may be exposed and developed to form the third color filter CF-B having a first opening B-OP1 and a second opening B-OP2. The filter portion BP1 and the light blocking portion BP2 may be provided as a single body.

Referring to FIG. 7B, the first color filter CF-R is disposed in the first opening B-OP1 defined in the third color filter CF-B. On the plane, the first color filter CF-R may entirely cover the first opening B-OP1 and may be disposed on at least a portion of the light blocking portion BP2. The second color filter CF-G is disposed in the second opening B-OP2 defined in the third color filter CF-B. On the plane, the second color filter CF-G may entirely cover the second opening B-OP2 and may be disposed on at least a portion of the light blocking portion BP2.

Referring again to FIG. 6, the light blocking layer SHD may be disposed on the light blocking portion BP2 of the third color filter CF-B. Each of a portion of the first color filter CF-R and a portion of the second color filter CF-G may be disposed on the light blocking layer SHD. An edge of the first color filter CF-R and the light blocking layer SHD may absorb the external light transmitted through the light blocking portion BP2 to prevent the colors from being mixed with each other between the first to third pixel areas PXA-R, PXA-G, and PXA-B. Also, the light blocking layer SHD may absorb a portion of light output from the light control layer CCL.

The first upper insulation layer IL may cover the first to third color filters CF-R, CF-G, and CF-B and may be disposed on the second base substrate BS2. For example, the first upper insulation layer IL may be provided as an inorganic layer.

The light control layer CCL is disposed on the first upper insulation layer IL. The light control layer CCL may control the first color light emitted from the display element layer DP-OLED (see FIG. 5). For example, the light control layer CCL may convert the first color light into different color light or transmit the first color light as it is.

The light control layer CCL includes a first conversion part CCF-R, a second conversion part CCF-G, and a transmission part CCF-B. The first conversion part CCF-R may overlap the first pixel area PXA-R to convert the first color light, and, thereby, emit the light having the second color different from the first color. The second conversion part CCF-G may overlap the second pixel area PXA-R to convert the first color light, and, thereby, emit the light having the third color different from the second color. The transmission part CCF-B may overlap the third pixel area PXA-B to transmit the first color light.

The second upper insulation layer RL may cover the light control layer CCL and may be disposed on the first upper insulation layer IL. For example, the second upper insulation layer RL may be provided as an inorganic layer.

For instance, referring to FIG. 7C, a first light emitting material EP-R may absorb the first color light that is the blue light to emit the second color light that is the red light, and a second light emitting material EP-G may absorb the first color light to emit the third color light that is the green light. The transmission part CCF-B may be a portion that does not include a light emitting material. The transmission part CCF-B may be a portion that transmits the first color light.

Each of the first conversion part CCF-R, the second conversion part CCF-G, and the transmission part CCF-B may include a base resin BR. The base resin BR may be a polymer resin. For example, the base resin BR may include at least one of an acrylic-based resin, a urethane-based resin, and a silicon-based resin, and an epoxy-based resin. The base resin BR may be a transparent resin.

In some exemplary embodiments, each of the first conversion part CCF-R, the second conversion part CCF-G, and the transmission part CCF-B may include scattering particles OL. The scattering particles OL may be at least one of titanium dioxide ($TiO_2$) and silica-based nano particles. The scattering particles OL may scatter light emitted from the light emitting material to emit the light to the outside of a conversion part. Also, when the member, such as the transmission part CCF-B, transmits the light as it is, the scattering particles OL may scatter the provided light to emit the light to the outside.

The first and second light emitting materials EP-R and EP-G (hereinafter, referred to as light emitting materials) contained in the light control layer CCL may be at least one of phosphors and quantum dots. For instance, the light control layer CCL according to some exemplary embodiments may include at least one of the phosphors and the quantum dots as the light emitting materials EP-R and EP-G.

For example, the phosphor used as the light emitting materials EP-R and EP-G may be inorganic phosphors. The phosphors used as the light emitting materials EP-R and EP-G in the display panel DP according to some exemplary embodiments may be at least one of green phosphors and red phosphors.

Kinds of phosphors used in the light control layer CCL according to some exemplary embodiments are not limited to the disclosed materials, and, thus, well-known phosphor materials alternatively or in addition to the above-described phosphors may be used.

In some exemplary embodiments, the light emitting materials EP-R and EP-G contained in the light control layer CCL may be quantum dots. The quantum dot may be selected from Group II-VI compounds, Group III-V compounds, Group IV-VI compounds, Group IV elements, Group IV compounds, and/or a combination thereof.

The Group II-VI compounds may be selected from binary element compounds selected from the group consisting of CdSe, CdTe, ZnS, ZnSe, ZnTe, ZnO, HgS, HgSe, HgTe, MgSe, MgS, and/or a combination including at least one of the binary element compounds, ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or a combination including at least one of the ternary element compounds, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and/or a combination including at least one of the quaternary element compounds.

Group I-III-VI compounds may be selected from three-element compounds selected from the group consisting of AgInS2, CuInS2, AgGaS2, CuGaS2, and mixtures thereof, or elemental compounds such as AgInGaS2, CuInGaS2.

The Group III-V compounds may be selected from binary element compounds selected from the group consisting of GaN, GaP, GaAs, GaSb, AlN, AlP, AlAs, AlSb, InN, InP, InAs, InSb, and/or a combination including at least one of the binary element compounds, ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and/or a combination including at least one of the ternary element compounds, and quaternary element compounds selected form the group consisting of GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and/or a combination including at least one of the quaternary element compounds. Meanwhile, the group III-V compound may further include a group II metal. For example, InZnP or the like may be selected as a III-II-V compound.

The Group IV-VI compounds may be selected from binary element compounds selected from the group consisting of SnS, SnSe, SnTe, PbS, PbSe, PbTe, and/or a combination including at least one of the binary element compounds, ternary element compounds selected from the group consisting of SnSeS, SnSeTe, SnSTe, PbSeS, PbSeTe, PbSTe, SnPbS, SnPbSe, SnPbTe, and/or a combination including at least one of the ternary element compounds, and quaternary element compounds selected form the group consisting of SnPbSSe, SnPbSeTe, SnPbSTe, and/or a combination including at least one of the quaternary element compounds. The Group IV elements may be selected from the group consisting of Si, Ge, and/or a combination thereof. The Group IV compounds may be binary element compounds selected from the group consisting of SiC, SiGe, and/or a combination thereof.

The binary element compounds, the ternary element compounds, and the quaternary element compounds may exist in the particle at a uniform concentration or exist in the particle in a state in which concentration distribution is partitioned into partially different states. Alternatively, the quantum dot may have a core-shell structure in which one quantum dot surrounds the other quantum dot. An interface between the core and the shell may have a concentration gradient in which an element existing in the shell has a concentration that gradually decreases toward a center.

In some exemplary embodiments, the quantum dot may have a core-shell structure, which includes a core including the above-described nano crystal and a shell surrounding the core. The shell of the quantum dot may serve as a protection layer that prevents the core from being chemically changed to maintain the semiconductor characteristics and/or perform a function of a charging layer for imparting electrophoretic characteristics to the quantum dot. The shell may be a single layer or a multi-layer structure. An interface between the core and the shell may have a concentration gradient in which an element existing in the shell has a concentration that gradually decreases toward a center. For example, the shell of the quantum dot may include an oxide of a metal or nonmetal, a semiconductor compound, or a combination thereof.

For example, the oxide of the metal or nonmetal may include at least one of binary element compounds, such as at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or ternary element compounds, such as at least one of $MgAl_2O_4$, $CoFe_2O_4$, $NiFe_2O_4$, $CoMn_2O_4$, and the like, but exemplary embodiments are not limited thereto.

The semiconductor compounds may include at least one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but exemplary embodiments are not limited thereto.

The quantum dot may have a full width at half maximum (FWHM) of an emission wavelength spectrum of about 45 nm or less, such as about 40 nm or less, for instance, about 30 nm or less. In this range, color purity and color reproducibility may be improved. Also, light emitted through the quantum dot may be emitted in all directions to improve an optical viewing angle.

In some exemplary embodiments, the quantum dot has a shape that is generally used in the art and is not specifically limited in shape. For instance, the quantum dot may have a spherical shape, a pyramidal shape, a multi-arm shape, a cubic nanoparticle shape, a nanotube shape, a nanowire shape, a nanofiber shape, a nanoplate particle shape, or the like.

The quantum dot may adjust a color of emitted light according to a size thereof. In this manner, the quantum dot may emit light having various colors, such as a blue color, a red color, and a green color. When each of the first light emitting material EP-R and the second light emitting material EP-G is the quantum dot, a particle size of the first light emitting material EP-R and a particle size of the second light emitting material EP-G may be different from each other. For example, the first light emitting material EP-R may have a particle size greater than that of the second light emitting material EP-G. The first light emitting material EP-R may emit light having a wavelength longer than that emitted from the second light emitting material EP-G.

Referring again to FIG. 6, as described with reference to FIG. 2, the inner space GP may be defined between the upper display substrate 200 and the lower display substrate 100. For instance, the display element layer DP-OLED and the light control layer CCL may be spaced apart from each other in the third direction DR3 due to the inner space GP between the upper display substrate 200 and the lower display substrate 100.

It is noted that the first color light emitted from the display element layer DP-OLED may not be accurately transmitted to the light control layer CCL due to the spaced space. As a result, the overall visibility of the display panel DP may be deteriorated. For example, light may be emitted from the second pixel area PXA-G and the third pixel area PXA-B of the first to third pixel areas PXA-R, PXA-G, and PXA-B. In this case, the first color light may be emitted from each of the two light emitting elements OLED overlapping the second pixel area PXA-G and the third pixel area PXA-B, and the first color light may not be emitted from the light emitting element OLED overlapping the first pixel area PXA-R. However, a portion of the first color light emitted from each of the two light emitting elements OLED may be transmitted to the first conversion part CCF-R overlapping the first pixel area PXA-R due to the spaced space. As a result, the second color light may be emitted from the first conversion part CCF-R and visible from the outside through the first pixel area PXA-R.

According to some exemplary embodiments, the display panel DP may be disposed on (or include) the light control layer CCL and include a partition wall DM overlapping the light blocking area NPXA. The partition wall DM may entirely overlap the light blocking area NPXA and have a predetermined height in the third direction DR3. Here, the third direction DR3 may be a thickness direction of the upper display substrate 200.

The partition wall DM according to some exemplary embodiments may prevent colors of light emitted to the outside through the upper display substrate 200 from being mixed with each other. For example, the first color light emitted from one light emitting element OLED may be emitted to the outside through the pixel area overlapping the one light emitting element OLED of the pixel areas PXA. For instance, the first color light emitted from the one light emitting element OLED may be prevented from being transmitted to the other pixel area, which does not overlap the one light emitting element OLED, of the pixel areas PXA through the partition wall DM. Also, the partition wall DM according to some exemplary embodiments may improve the light emission efficiency of the light emitted to the outside through the pixel area.

Referring to FIG. 8, the partition wall DM may be disposed on the second upper insulation layer RL overlapping the light blocking area NPXA. Hereinafter, for convenience of description and illustration, it is assumed that the second upper insulation layer RL disposed between the partition wall DM and the control layer CCL is omitted, and the structure in which the partition wall DM is disposed on the light control layer CCL will be described. It is also contemplated that the second upper insulation layer RL may be omitted.

According to some exemplary embodiments, the partition wall DM may include a partition wall part PC and a reflection part RC covering the partition wall part PC.

The partition wall part PC may surround the first to third pixel areas PXA-R, PXA-G, and PXA-B on the plane and may extend from the light control layer CCL by a predetermined height in the third direction DR3. At least a portion of the partition wall part PC may be disposed on a top surface of the light control layer CCL, and the other portion of the partition wall part PC may be disposed on the light blocking portion BP2 of the third color filter CF-B. For instance, the other portion of the partition wall part PC may be disposed on a first conversion part CCF-R, a second conversion part CCF-G, and a transmission part CCF-B of the light control layer CCL. In this specification, the disposition on the same layer means that two constituents different from each other are disposed directly on one constituent.

The partition wall part PC may have a color that absorbs the wavelength range of the first color light. For example, the partition wall part PC may have a black color.

The reflection part RC may overlap the light blocking area NPXA and cover at least a portion of the partition wall part PC. For example, as illustrated in FIG. 8, the reflection part RC may entirely cover an outer surface of the partition wall part PC and may be disposed on the light control layer CCL. The reflection part RC may be made of a material having high reflectivity. For example, the reflection part RC may be made of a metal material, such as aluminum, copper, and/or the like.

According to some exemplary embodiments, since the reflection part RC is made of the metal material and covers the outer surface of the partition wall part PC, light emission efficiency of the light transmitted to the light control layer CCL may be increased.

For instance, referring to FIG. 9, the lower display substrate 100 includes an emission area EA through which the first color light is emitted and a non-emission area NEA adjacent to the emission area EA. Hereinafter, a case in which the first color light that is emitted through the emission area EA of FIG. 9 is transmitted to one conversion part CCFz provided in the light control layer CCL.

As described above, the first color light emitted through one emission area EA may not be transmitted in only a direction facing the conversion part CCFz, but may be also emitted in a direction facing another conversion part overlapping another pixel area. Hereinafter, the light, which is emitted in the direction facing the conversion part CCFz, of the first color light emitted through the emission area EA is defined as first light, and the light emitted in the direction facing the other conversion part is defined as second light.

The reflection part RC of the partition wall DM according to some exemplary embodiments may reflect the second light to transmit the second light to the conversion part CCFz. As a result, an amount of light transmitted from the emission area EA to the conversion part CCFz may increase. Also, since the amount of light transmitted to the conversion part CCFz increases, the light emitted to the outside through the pixel area PXA overlapping the conversion part CCFz may be improved in light emission efficiency. Thus, the overall visibility of the display panel DP may also be improvised.

According to some exemplary embodiments, as illustrated in FIGS. 6 and 9, the partition wall DM may be spaced a predetermined distance from the lower display substrate 100. Also, the partition wall DM may have a predetermined height from the upper display substrate 200 in the third direction DR3.

For example, in the third direction DR3, a height between the light control layer CCL of the upper display substrate 200 and the lower display substrate 100 is defined as a first length D1$a$, and a height of the partition wall DM is defined as a second length D1$b$. In this case, the second length D1$b$ may be about 0.6 times to about 0.95 times the first length D1$a$. Since the partition wall DM has the second length D1$b$, a greater amount of second light may be reflected through the partition wall DM.

In some exemplary embodiments, the partition wall part PC includes a first portion PCa and a second portion PCb adjacent to the first portion PCa. The first portion PCa and the second portion PCb may be integrated with each other. That is, the first portion PCa and the second portion PCb may be formed through the same process.

The first portion PCa may overlap the light blocking area NPXA and be disposed in a space between adjacent two parts of the first conversion part CCF-R, the second conversion part CCF-G, and the transmission part CCF-B. For instance, the first portion PCa may be a portion disposed on a color filter layer together with the first conversion part CCF-R, the second conversion part CCF-G, and the transmission part CCF-B. For example, the first portion PCa may entirely overlap the light blocking layer SHD of FIG. 6.

The second portion PCb may be a portion disposed on a bottom surface of each of the first conversion part CCF-R, the second conversion part CCF-G, and the transmission part CCF-B, which faces the lower display substrate 100. The second portion PCb may have a width D2$a$ greater than a width D2$b$ of the first portion PCa on the plane. Also, in this specification, the outer surface of the partition wall DM means an outer surface of the second portion PCb. That is, the outer surface of the partition wall DM means the second portion PCb that is exposed to the inner space GP.

According to some exemplary embodiments, the second portion PCb may have a height greater than that of the first portion PCa in the third direction DR3. The second length D1b of the partition wall DM described with reference to FIG. 9 means the height of the second portion PCb.

Also, according to some exemplary embodiments, a filler CPz may be disposed in the inner space GP between the upper display substrate 200 and the lower display substrate 100. In this case, since the partition wall DM is spaced a predetermined distance from the lower display substrate 100, the filler CPz may be entirely disposed in the inner space GP. The filler CPz may be provided as a transparent material to constantly maintain the spaced distance between the upper display substrate 200 and the lower display substrate 100.

Figure 10:
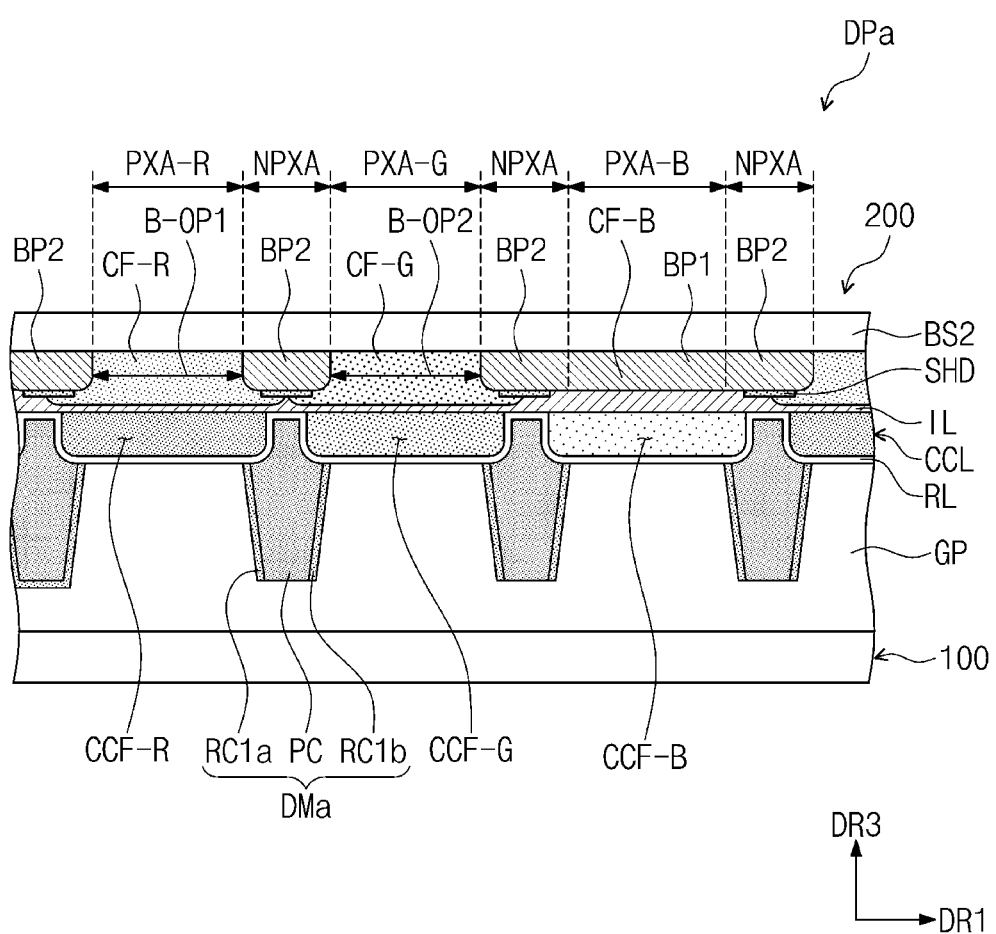
FIG. 10 is a cross-sectional view of a display panel according to some exemplary embodiments.

FIG. 10 is a cross-sectional view of a display panel according to some exemplary embodiments. A display panel DPa of FIG. 10 is substantially the same as the display panel DP, except for a structure of a partition wall DMa. Thus, for convenience of description, the structure of the partition wall DMa will be mainly described with reference to FIG. 10.

Referring to FIG. 10, the partition wall DMa includes a partition wall part PC and reflection parts RC1a and RC1b, which are spaced apart from each other with the partition wall part PC therebetween.

According to some exemplary embodiments, the reflection parts RC1a and RC1b may expose at least a portion of the partition wall part PC. At least the portion of the partition wall part PC may be an outer surface of the partition wall part PC, which is exposed to an inner space GP and faces a lower display substrate 100. The reflection parts RC1a and RC1b may be spaced apart from each other with the partial portion of the partition wall part PC, which is exposed to the inner space GP.

When first color light emitted from a display element layer DP-OLED of the lower display substrate 100 is transmitted through the partial portion, the first color light may be absorbed by the partition wall part PC.

Figure 11A:
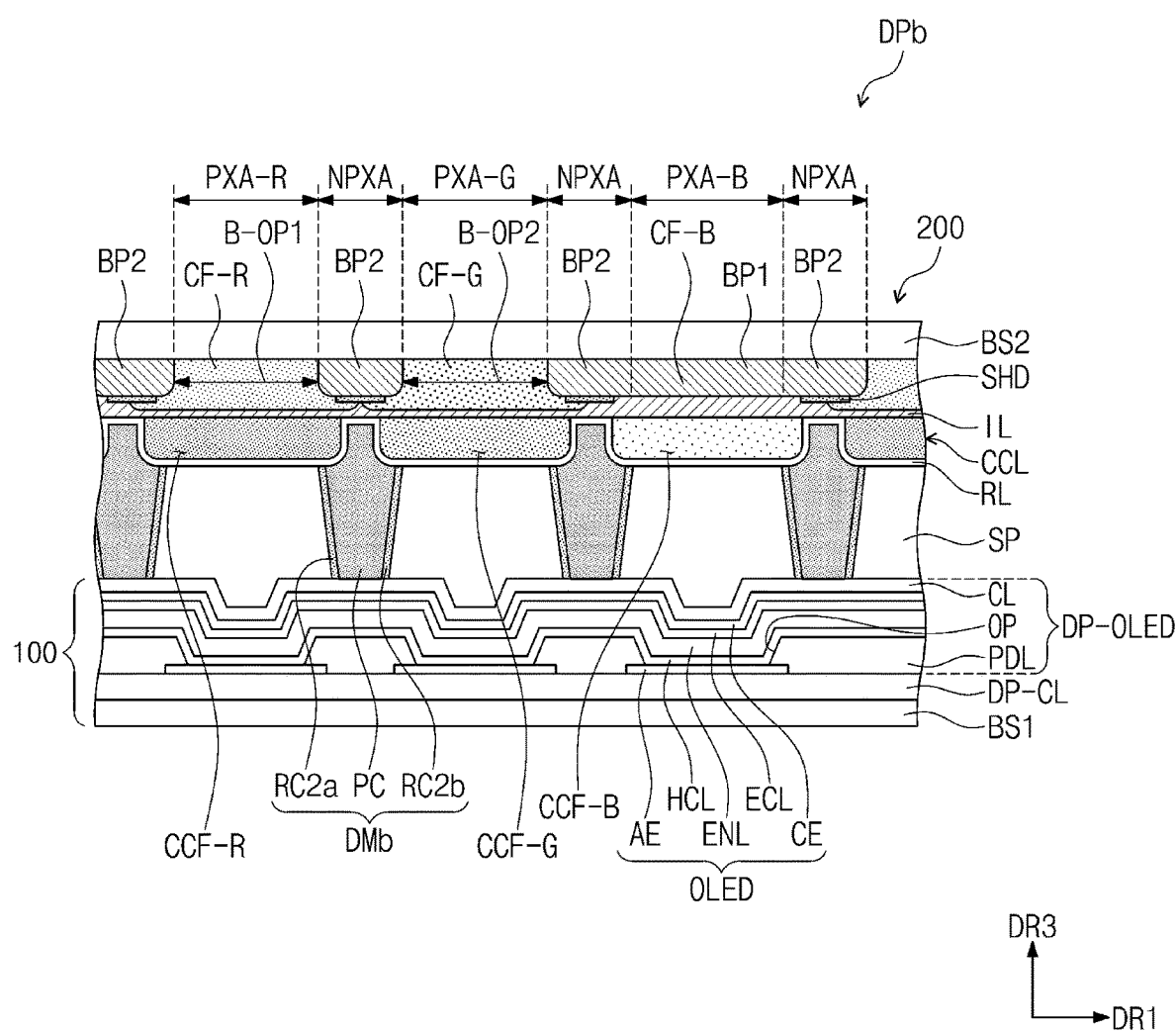
FIG. 11A is a cross-sectional view of a display panel according to some exemplary embodiments.
Figure 11B:
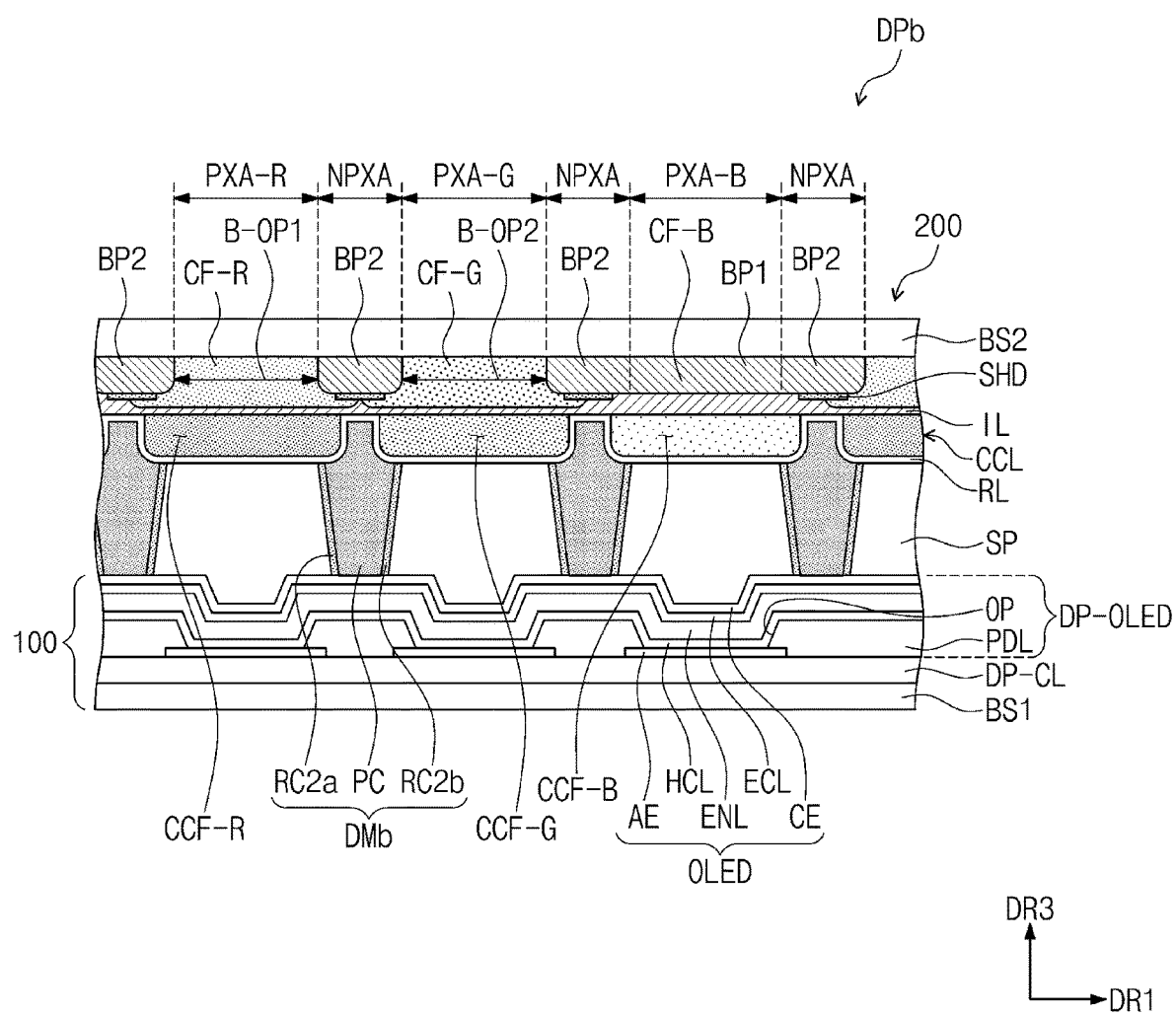
FIG. 11B is a cross-sectional view of a display panel according to some exemplary embodiments.

FIG. 11A is a cross-sectional view of a display panel according to some exemplary embodiments. FIG. 11B is a cross-sectional view of a display panel according to some exemplary embodiments.

A display panel DPb of FIGS. 11A and 11B may be substantially similar to the display panel DPa of FIG. 10, except for a structure of a partition wall DMb. Thus, for convenience of description, the structure of the partition wall DMb will be mainly described with reference to FIGS. 11A and 11B.

Referring to FIGS. 11A and 11B, the partition wall DMb may contact a lower display substrate 100. That is, a plurality of spaces SP may be defined by the partition wall DMb, an upper display substrate 200, and a lower display substrate 100. The plurality of spaces SP may overlap a plurality of pixel areas PXA, respectively.

The partition wall DMb includes a partition wall part PC and reflection parts RC2a and RC2b, which are spaced apart from each other with the partition wall part PC therebetween. The reflection parts RC2a and RC2b may expose at least a portion of the partition wall part PC.

According to some exemplary embodiments, each of the reflection parts RC2a and RC2b and the partition wall part PC, which is exposed by the reflection parts RC2a and RC2b, may contact the lower display substrate 100. For example, referring to FIG. 11A, each of the reflection parts RC2a and RC2b and the partition wall part PC, which is exposed by the reflection parts RC2a and RC2b, may be disposed directly on a cover layer CL of a display element layer DP-OLED.

In comparison, referring to FIG. 11B, each of the reflection parts RC2a and RC2b and the partition wall part PC, which is exposed by the reflection parts RC2a and RC2b, may be disposed directly on a second electrode CE of the display element layer DP-OLED. In this case, the cover layer CL may be omitted.

Although the structure in which at least a portion of the partition wall part PC is exposed by the reflection parts RC2a and RC2b is described with reference to FIGS. 11A and 11B, exemplary embodiments are not limited thereto. For instance, the reflection parts R2Ca and R2Cb may entirely cover an outer surface of the partition wall part PC.

According to various exemplary embodiments, a partition wall may prevent colors output to the outside through an upper display substrate from being mixed with each other. For instance, a first color light emitted from one light emitting element may be prevented from being transmitted to another pixel area, which does not overlap the one light emitting element, of the pixel areas. Also, the partition wall according to various exemplary embodiments may improve light emission efficiency of the light emitted to the outside through a pixel area. As such, the overall display quality of the display panel may be improved.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display panel comprising:
   an upper display substrate comprising a display area and a non-display area adjacent to the display area, the display area comprising pixel areas and a light blocking area adjacent to the pixel areas;
   a lower display substrate comprising display elements configured to emit light having a first color and respectively overlapping the pixel areas; and
   a partition wall comprising a partition wall part overlapping the light blocking area and a reflection part disposed on the partition wall part,
   wherein the upper display substrate comprises:
   a base substrate;
   a color filter layer disposed on the base substrate; and
   a light control layer disposed on the color filter layer and configured to control the light having the first color, and
   wherein the partition wall is disposed on the light control layer.

2. The display panel of claim 1, wherein the partition wall is spaced a predetermined distance from the lower display substrate.

3. The display panel of claim 2, wherein:
   a height between the light control layer and the lower display substrate is defined as a first length in a thickness direction of the upper display substrate;
   a height of the partition wall is defined as a second length in the thickness direction; and
   the second length is 0.6 times to 0.95 times the first length.

4. The display panel of claim 2, further comprising:
   an adhesion member overlapping the non-display area and disposed between the upper display substrate and the lower display substrate to define an inner space together with the upper display substrate and the lower display substrate.

5. The display panel of claim 4, further comprising:
a filler disposed in the inner space.

6. The display panel of claim 2, wherein the reflection part exposes at least a portion of the partition wall part facing the lower display substrate.

7. The display panel of claim 1, wherein:
the pixel areas comprise first to third pixel areas arranged in one direction; and
the light control layer comprises:
   a first conversion part overlapping the first pixel area and configured to convert light having the first color so as to emit light having a second color different from the first color;
   a second conversion part overlapping the second pixel area and configured to convert light having the first color so as to emit light having a third color different from the second color; and
   a transmission part overlapping the third pixel area and configured to transmit light having the first color.

8. The display panel of claim 7, wherein the partition wall part comprises:
   a first portion disposed in a space between two adjacent parts of the first conversion part, the second conversion part, and the transmission part; and
   a second portion adjacent to the first portion and disposed on bottom surfaces of the two adjacent parts.

9. The display panel of claim 8, wherein, in a thickness direction of the upper display substrate, a height of the second portion is greater than a height of the first portion.

10. The display panel of claim 8, wherein a width of the second portion is greater than a width of the first portion.

11. The display panel of claim 1, wherein:
the pixel areas comprise first to third pixel areas arranged in one direction; and
the color filter layer comprises:
   a first color filter overlapping the first pixel area and configured to transmit light having a second color different from the first color;
   a second color filter overlapping the second pixel area and configured to transmit light having a third color different from the second color; and
   a third color filter overlapping the third pixel area and configured to transmit the light having the first color.

12. The display panel of claim 11, wherein the third color filter comprises:
   a filter portion overlapping the third pixel area; and
   a light blocking portion overlapping the light blocking area.

13. The display panel of claim 12, wherein:
the color filter layer is disposed directly on the base substrate; and
at least a portion of the partition wall is disposed on the light blocking portion overlapping the light blocking area.

14. The display panel of claim 1, wherein the partition wall is black in color.

15. The display panel of claim 1, wherein:
the partition wall is disposed between the upper display substrate and the lower display substrate to contact each of the upper display substrate and the lower display substrate; and
spaces respectively overlapping the pixel areas are defined by the partition wall, the upper display substrate, and the lower display substrate.

16. The display panel of claim 15, wherein:
the reflection part exposes at least a portion of the partition wall part; and
the exposed portion of the partition wall part contacts the lower display substrate.

17. The display panel of claim 15, wherein:
the lower display substrate comprises:
   a lower base substrate;
   a circuit element layer disposed on the lower base substrate; and
   a display element layer disposed on the circuit element layer and comprising the display elements; and
the partition wall contacts the display element layer.

18. The display panel of claim 17, wherein:
the display element layer further comprises a cover layer disposed on the display elements; and
the partition wall is disposed on the cover layer.

* * * * *